(12) United States Patent
Hong

(10) Patent No.: US 10,977,117 B2
(45) Date of Patent: Apr. 13, 2021

(54) MEMORY DEVICE, A MEMORY SYSTEM AND AN OPERATING METHOD THEREOF

(71) Applicant: SK hynix Inc., Gyeonggi-do (KR)

(72) Inventor: Jiman Hong, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 50 days.

(21) Appl. No.: 16/196,471

(22) Filed: Nov. 20, 2018

(65) Prior Publication Data

US 2019/0332472 A1 Oct. 31, 2019

(30) Foreign Application Priority Data

Apr. 27, 2018 (KR) .................... 10-2018-0049183

(51) Int. Cl.
| | |
|---|---|
| *G06F 11/10* | (2006.01) |
| *G11C 29/42* | (2006.01) |
| *G11C 29/52* | (2006.01) |
| *G11C 16/10* | (2006.01) |
| *G11C 16/26* | (2006.01) |
| *G11C 7/10* | (2006.01) |
| *G11C 11/56* | (2006.01) |
| *G11C 8/10* | (2006.01) |
| *G11C 29/04* | (2006.01) |

(52) U.S. Cl.
CPC ...... *G06F 11/1068* (2013.01); *G06F 11/1004* (2013.01); *G11C 7/1039* (2013.01); *G11C 11/5628* (2013.01); *G11C 16/10* (2013.01); *G11C 16/26* (2013.01); *G11C 29/42* (2013.01); *G11C 29/52* (2013.01); *G11C 8/10* (2013.01); *G11C 2029/0411* (2013.01); *G11C 2211/5642* (2013.01)

(58) Field of Classification Search
CPC ............................ G11C 16/26; G06F 11/1068
See application file for complete search history.

(56) References Cited

U.S. PATENT DOCUMENTS

| | | | | |
|---|---|---|---|---|
| 9,715,429 B1* | 7/2017 | Lin | ...................... | G06F 3/0619 |
| 10,084,487 B2* | 9/2018 | Jin | ......................... | G11C 29/52 |
| 2009/0003058 A1* | 1/2009 | Kang | .................. | G11C 11/5642 |
| | | | | 365/185.03 |
| 2010/0002506 A1* | 1/2010 | Cho | ..................... | G11C 11/5628 |
| | | | | 365/185.03 |
| 2010/0199138 A1* | 8/2010 | Rho | ..................... | G06F 11/1048 |
| | | | | 714/746 |
| 2011/0145663 A1* | 6/2011 | Kong | .................. | G06F 11/1068 |
| | | | | 714/704 |

(Continued)

FOREIGN PATENT DOCUMENTS

| | | |
|---|---|---|
| KR | 1020130015643 | 2/2013 |
| KR | 1020150116270 | 10/2015 |

*Primary Examiner* — Steve N Nguyen

(74) *Attorney, Agent, or Firm* — IP & T Group LLP

(57) ABSTRACT

An operating method of memory system may include: reading target data stored in a target memory page, using a plurality of read voltages, respectively; sequentially storing read data corresponding to the target data in a plurality of latches including a first latch and a second latch, respectively; performing a first error correction code (ECC) decoding operation on first read data stored in the first latch; and performing a second ECC decoding operation on second read data stored in the second latch, when the first ECC decoding operation fails.

18 Claims, 10 Drawing Sheets

(56) References Cited

U.S. PATENT DOCUMENTS

| | | | | |
|---|---|---|---|---|
| 2011/0197015 A1* | 8/2011 | Chae | ............. | G11C 11/5642 711/103 |
| 2011/0235415 A1* | 9/2011 | Park | ............. | G11C 11/5642 365/185.09 |
| 2012/0265927 A1* | 10/2012 | Cho | ............. | G11C 11/5642 711/103 |
| 2014/0129902 A1* | 5/2014 | Yoon | ............. | G11C 11/5642 714/764 |
| 2014/0355340 A1* | 12/2014 | Sharon | ............. | G11C 16/26 365/185.03 |
| 2015/0006983 A1* | 1/2015 | Lin | ............. | G11C 29/50004 714/721 |
| 2017/0308438 A1* | 10/2017 | Yim | ............. | G06F 11/1402 |
| 2018/0246782 A1* | 8/2018 | Zeng | ............. | G11C 29/42 |

\* cited by examiner

MEMORY DEVICE, A MEMORY SYSTEM AND AN OPERATING METHOD THEREOF

CROSS-REFERENCE TO RELATED APPLICATIONS

The present application claims priority under 35 U.S.C. § 119(a) to Korean Patent Application No. 10-2018-0049183 filed on Apr. 27, 2018, the disclosure of which is incorporated herein by reference in its entirety.

BACKGROUND

1. Field

Various exemplary embodiments of the present invention relate generally to a memory device and a memory system employing the memory device. Particularly, exemplary embodiments relate to a memory device and a memory system capable of improved, more efficient reading of target data corresponding to a host read request, and an operating method thereof.

2. Description of the Related Art

The computer environment paradigm has moved towards ubiquitous computing enabling the use of computing systems anytime and anywhere. As a result, the demand for portable electronic devices, such as mobile phones, digital cameras, and laptop computers has increased rapidly.

Generally, electronic devices may employ a memory system using one or more memory devices for storing data. The memory system may be used as a main memory unit or an auxiliary memory unit of an electronic device.

A memory system, does not have any mechanical driving part, and, hence, may provide advantages such as excellent stability and durability, fast information access speed, and low power consumption. Generally, a memory system may have faster data access rate and lower power consumption than a hard disk storage device. Non-limiting examples of memory systems having such advantages include memory systems employing universal serial bus (USB) memory devices, smart memory cards of diverse interfaces, solid-state drives (SSD) and the like.

SUMMARY

Various embodiments of the present invention are directed to a memory device and a memory system employing the memory device which are capable of performing improved, more efficient reading of target data corresponding to a host request. Various embodiments of the present invention are also directed to a method of operation of the memory system for improved, more efficient reading of target data corresponding to a host read request.

In accordance with an embodiment of the present invention, an operating method of memory system may include: reading target data stored in a target memory page, using a plurality of read voltages, respectively; sequentially storing read data corresponding to the target data in a plurality of latches including a first latch and a second latch, respectively; performing a first error correction code (ECC) decoding operation on first read data stored in the first latch; and performing a second ECC decoding operation on second read data stored in the second latch, when the first ECC decoding operation fails.

In accordance with an embodiment of the present invention, a memory system may include: a memory device comprising: a read/write circuit comprising a plurality of latches in a page buffer; and a control circuit suitable for controlling the read/write circuit to read the target data stored in a target memory page using a plurality of read voltages, respectively, and to sequentially store read data corresponding to the target data in a plurality of latches including a first latch and a second latch, respectively; and a controller suitable for performing a first ECC decoding operation on first read data stored in the first latch, and performing a second ECC decoding operation on second read data stored in the second latch, when the first ECC decoding operation fails.

In accordance with an embodiment of the present invention, a memory device may include: a read/write circuit comprising a plurality of latches in a page buffer; and a control circuit suitable for controlling the read/write circuit to read the target data stored in a target page using a plurality of read voltages, respectively, and to sequentially store read data corresponding to the target data in a plurality of latches including a first latch and a second latch, respectively.

In accordance with an embodiment of the present invention, a memory system may include: a memory device; and a controller, wherein the memory device includes: a memory cell array including a target region for storing target data; a region buffer including a plurality of latches including a first latch and a second latch; and a control circuit suitable for: sequentially reading the target data using a plurality of read voltages in response to a read command from the controller; and sequentially storing read data corresponding to the target data in the first and second latches, wherein the controller loads first read data stored in the first latch and performs a first decoding operation on the first read data, and wherein the controller loads second read data stored in the second latch and performs a second decoding operation on the second read data, when the first decoding operation fails.

BRIEF DESCRIPTION OF THE DRAWINGS

These and other features and advantages of the present invention will become apparent to those skilled in the art of the invention from the following detailed description. The description herein makes reference to the accompanying drawings wherein like reference numerals refer to like parts throughout the several views, and wherein.

DETAILED DESCRIPTION

Figure 1:
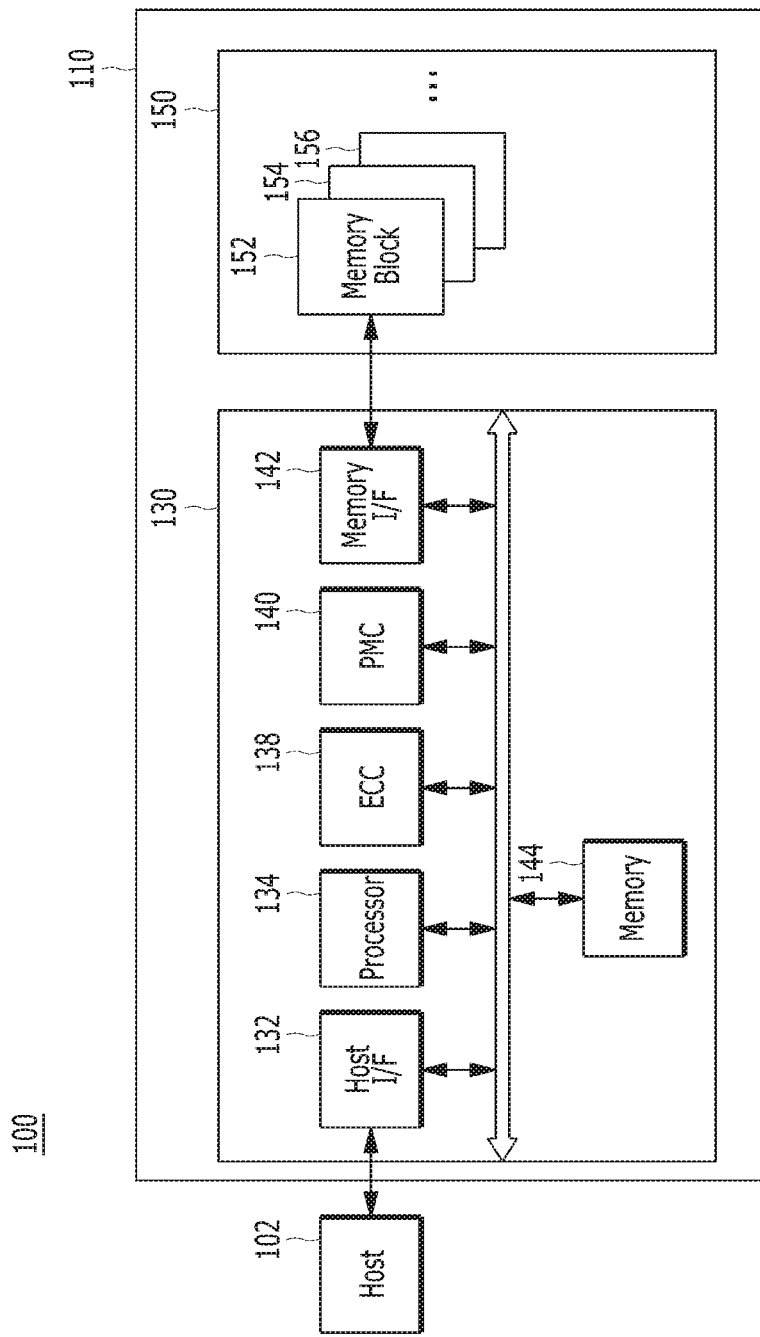
FIG. 1 is a block diagram illustrating a data processing system including a memory system operatively coupled to a host, in accordance with an embodiment of the present disclosure.

Various examples of the disclosure of the present invention are described below in more detail with reference to the accompanying drawings. The disclosure may be embodied in different other embodiments, forms and variations thereof and should not be construed as being limited to the embodiments set forth herein. Rather, the described embodiments are provided so that this disclosure will be thorough and complete, and will fully convey the present invention to those skilled in the art to which this invention belongs or pertains. Throughout the disclosure, like reference numerals refer to like parts throughout the various figures and examples of the disclosure. It is noted that reference to "an embodiment" does not necessarily mean only one embodiment, and different references to "an embodiment" are not necessarily to the same embodiment(s).

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated in order to clearly illustrate features of the embodiments. When an element is referred to as being connected or coupled to another element, it should be understood that the former can be directly connected or coupled to the latter, or electrically connected or coupled to the latter via an intervening element therebetween.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The terminology used herein is for the purpose of describing particular embodiments only and is not intended to be limiting of the present invention.

As used herein, singular forms are intended to include the plural forms and vice versa, unless the context clearly indicates otherwise.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, a feature or element described in connection with one embodiment may be used singly or in combination with other features or elements of another embodiment, unless otherwise specifically indicated.

FIG. 1 is a block diagram illustrating a data processing system 100, in accordance with an embodiment of the present invention.

Referring to FIG. 1, the data processing system 100 may include a host 102 operatively coupled to a memory system 110.

The host 102 may include, for example, a portable electronic device such as a mobile phone, an MP3 player and a laptop computer or an electronic device such as a desktop computer, a game player, a television (TV), a projector and the like.

The memory system 110 may operate or perform a specific function or operation in response to a request from the host 102 and, particularly, may store data to be accessed by the host 102. The memory system 110 may be used as a main memory system or an auxiliary memory system of the host 102. The memory system 110 may be implemented with any one of various types of storage devices, which may be electrically coupled with the host 102, according to a protocol of a host interface. Non-limiting examples of suitable storage devices include a solid state drive (SSD), a multimedia card (MMC), an embedded MMC (eMMC), a reduced size MMC (RS-MMC) and a micro-MMC, a secure digital (SD) card, a mini-SD and a micro-SD, a universal serial bus (USB) storage device, a universal flash storage (UFS) device, a compact flash (CF) card, a smart media (SM) card, a memory stick, and the like.

The storage devices for the memory system 110 may be implemented with a volatile memory device such, for example, as a dynamic random access memory (DRAM) and a static RAM (SRAM) and/or a nonvolatile memory device such as a read only memory (ROM), a mask ROM (MROM), a programmable ROM (PROM), an erasable programmable ROM (EPROM), an electrically erasable programmable ROM (EEPROM), a ferroelectric RAM (FRAM), a phase-change RAM (PRAM), a magneto-resistive RAM (MRAM), a resistive RAM (RRAM or ReRAM) and a flash memory.

The memory system 110 may include a controller 130 and a memory device 150. The memory device 150 may store data to be accessed by the host 102, and the controller 130 may control storage of data in the memory device 150.

The controller 130 and the memory device 150 may be integrated into a single semiconductor device, which may be included in the various types of memory systems as exemplified above.

The memory system 110 may be configured as a part of, for example, a computer, an ultra-mobile PC (UMPC), a workstation, a net-book, a personal digital assistant (PDA), a portable computer, a web tablet, a tablet computer, a wireless phone, a mobile phone, a smart phone, an e-book, a portable multimedia player (PMP), a portable game player, a navigation system, a black box, a digital camera, a digital multimedia broadcasting (DMB) player, a 3-dimensional (3D) television, a smart television, a digital audio recorder, a digital audio player, a digital picture recorder, a digital picture player, a digital video recorder, a digital video player, a storage configuring a data center, a device capable of transmitting and receiving information under a wireless environment, one of various electronic devices configuring a home network, one of various electronic devices configuring a computer network, one of various electronic devices configuring a telematics network, a radio frequency identification (RFID) device, or one of various components configuring a computing system.

The memory device 150 may be a nonvolatile memory device and may retain data stored therein even while an electrical power is not supplied. The memory device 150 may store data provided from the host 102 through a write operation, and provide data stored therein to the host 102 through a read operation. The memory device 150 may include a plurality of memory blocks 152 to 156, each of the memory blocks 152 to 156 may include a plurality of pages. Each of the plurality of pages may include a plurality of memory cells to which a plurality of word lines (WL) are electrically coupled.

The controller 130 may control overall operations of the memory device 150, such as read, write, program and erase operations. For example, the controller 130 may control the memory device 150 in response to a request from the host 102. The controller 130 may provide the data, read from the memory device 150, with the host 102, and/or may store the data, provided by the host 102, into the memory device 150.

The controller 130 may include a host interface (I/F) 132, a processor 134, an error correction code (ECC) unit 138, a power management unit (PMU) 140, a memory interface (I/F) 142, and a memory 144 all operatively coupled via an internal bus.

The host interface 132 may process commands and data provided from the host 102, and may communicate with the host 102 through at least one of various interface protocols such as universal serial bus (USB), multimedia card (MMC), peripheral component interconnect-express (PCI-e or PCIe), small computer system interface (SCSI), serial-attached SCSI (SAS), serial advanced technology attachment (SATA), parallel advanced technology attachment (PATA), small computer system interface (SCSI), enhanced small disk interface (ESDI) and integrated drive electronics (IDE).

The ECC unit 138 may detect and correct errors in the data read from the memory device 150 during the read operation. When the number of the error bits is greater than or equal to a threshold number of correctable error bits, the ECC unit 138 may not correct error bits but may output an error correction fail signal indicating failure in correcting the error bits.

The ECC unit 138 may perform an error correction operation based on a coded modulation such as a low density parity check (LDPC) code, a Bose-Chaudhuri-Hocquenghem (BCH) code, a turbo code, a Reed-Solomon (RS) code, a convolution code, a recursive systematic code (RSC), a trellis-coded modulation (TCM), a Block coded modulation (BCM), and so on. The ECC unit 138 may include all or some of circuits, modules, systems or devices for performing the error correction operation based on at least one of the above described codes.

The PMU 140 may provide and manage power of the controller 130.

The memory interface 142 may serve as an interface for handling commands and data transferred between the controller 130 and the memory device 150, to allow the controller 130 to control the memory device 150 in response to a request delivered from the host 102. The memory interface 142 may generate a control signal for the memory device 150 and may process data entered into or outputted from the memory device 150 under the control of the processor 134, in a case when the memory device 150 is a flash memory and, in particular, when the memory device 150 is a NAND flash memory.

The memory 144 may serve as a working memory of the memory system 110 and the controller 130, and may store temporary or transactional data for operating or driving the memory system 110 and the controller 130. The controller 130 may control the memory device 150 in response to a request from the host 102. The controller 130 may deliver data read from the memory device 150 into the host 102, may store data entered through the host 102 within the memory device 150. The memory 144 may be used to store data required for the controller 130 and the memory device 150 in order to perform these operations.

The memory 144 may be implemented with a volatile memory. The memory 144 may be implemented with a static random access memory (SRAM) or a dynamic random access memory (DRAM). Although FIG. 1 exemplifies the memory 144 disposed within the controller 130, the disclosure is not limited thereto. That is, the memory 144 may be located inside or outside the controller 130. For instance, the memory 144 may be embodied by an external volatile memory having a memory interface transferring data and/or signals transferred between the memory 144 and the controller 130.

The processor 134 may control the overall operations of the memory system 110. The processor 134 may drive or execute a firmware to control the overall operations of the memory system 110. The firmware may be referred to as a flash translation layer (FTL).

An FTL may perform an operation as an interface between the host 102 and the memory device 150. The host 102 may transmit requests for write and read operations to the memory device 150 through the FTL.

The FTL may manage operations of address mapping, garbage collection, wear-leveling and so forth. Particularly, the FTL may store map data. Therefore, the controller 130 may map a logical address, which is provided from the host 102, to a physical address of the memory device 150 through the map data. The memory device 150 may perform an operation like a general device because of the address mapping operation. Also, through the address mapping operation based on the map data, when the controller 130 updates data of a particular page, the controller 130 may program new data on another empty page and may invalidate old data of the particular page due to a characteristic of a flash memory device. Further, the controller 130 may store map data of the new data into the FTL.

The processor 134 may be implemented with a microprocessor or a central processing unit (CPU). The memory system 110 may include one or more processors 134.

A management unit (not shown) may be included in the processor 134. The management unit may perform bad block management of the memory device 150. The management unit may find bad memory blocks included in the memory device 150, which are in unsatisfactory condition for further use, as well as perform bad block management on the bad memory blocks. When the memory device 150 is a flash memory, for example, a NAND flash memory, a program failure may occur during the write operation, for example, during the program operation, due to characteristics of a NAND logic function. During the bad block management, the data of the program-failed memory block or the bad memory block may be programmed into a new memory block. The bad blocks may seriously aggravate the utilization efficiency of the memory device 150 having a 3D stack structure and the reliability of the memory system 100, and thus reliable bad block management is required.

Figure 2:
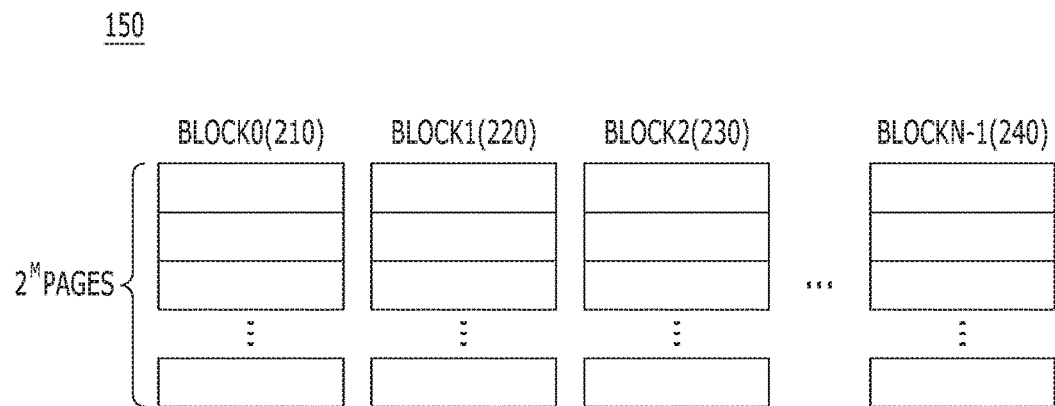
FIG. 2 is a schematic diagram illustrating an exemplary configuration of a memory device employed in the memory system shown in FIG. 1.

FIG. 2 is a schematic diagram illustrating the memory device 150.

Referring to FIG. 2, the memory device 150 may include the plurality of memory blocks BLOCK 0 to BLOCKN−1, and each of the blocks BLOCK 0 to BLOCKN−1 may include a plurality of pages, for example, $2^M$ pages, the number of which may vary according to circuit design. The memory device 150 may include a plurality of memory blocks, as single level cell (SLC) memory blocks and multi-level cell (MLC) memory blocks, according to the number of bits which may be stored or expressed in each memory cell. The SLC memory block may include a plurality of pages which are implemented with memory cells each capable of storing 1-bit data. The MLC memory block may include a plurality of pages which are implemented with memory cells each capable of storing multi-bit data, for example, two or more-bit data. An MLC memory block including a plurality of pages which are implemented with memory cells that are each capable of storing 3-bit data may be defined as a triple level cell (TLC) memory block.

Figure 3:
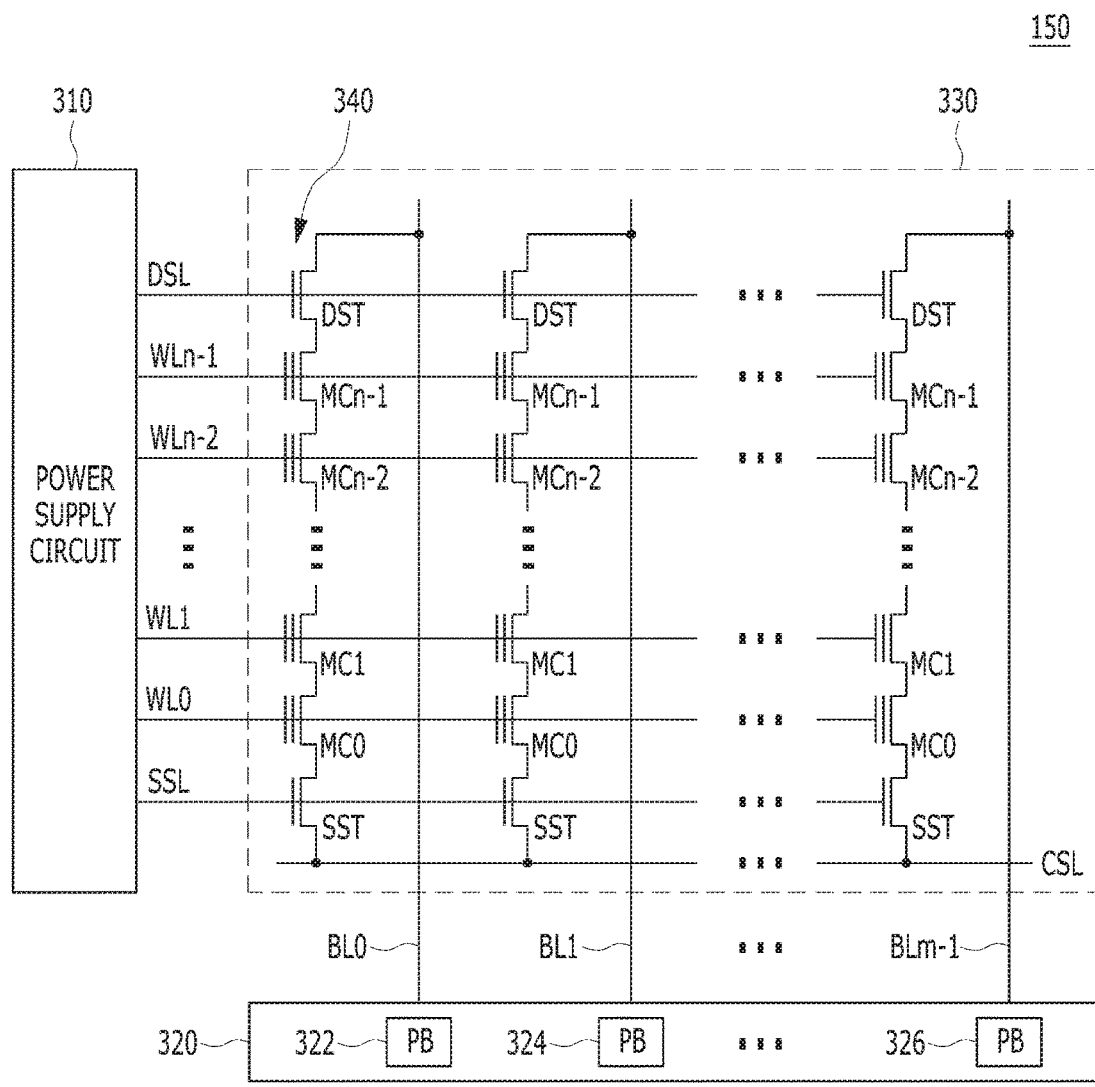
FIG. 3 is a circuit diagram illustrating an exemplary configuration of a memory cell array of a memory block of the memory device shown in FIG. 2.

FIG. 3 is a circuit diagram illustrating a memory block 330 in the memory device 150.

Referring to FIG. 3, the memory block 330 may correspond to any of the plurality of memory blocks 152 to 156 included in the memory device 150 of the memory system 110.

The memory block 330 of the memory device 150 may include a plurality of cell strings 340 which are electrically coupled to bit lines BL0 to BLm−1, respectively. The cell string 340 of each column may include at least one drain select transistor DST and at least one source select transistor SST. A plurality of memory cells or a plurality of memory cell transistors MC0 to MCn−1 may be electrically coupled in series between the select transistors DST and SST. The respective memory cells MC0 to MCn−1 may be configured by single level cells (SLC) each of which may store 1 bit of information, or by multi-level cells (MLC) each of which may store data information of a plurality of bits. The strings 340 may be electrically coupled to the corresponding bit lines BL0 to BLm−1, respectively. For reference, in FIG. 3, 'DSL' denotes a drain select line, 'SSL' denotes a source select line, and 'CSL' denotes a common source line.

While FIG. 3 only shows, as an example, that the memory block 330 is constituted with NAND flash memory cells, it is to be noted that the memory block 330 of the memory device 150 according to the embodiment is not limited to a NAND flash memory. The memory block 330 may be realized by a NOR flash memory, a hybrid flash memory in which at least two kinds of memory cells are combined, or one-NAND flash memory in which a controller is built in a memory chip. The operational characteristics of a semiconductor device may be applied to not only a flash memory device in which a charge storing layer is configured by conductive floating gates but also a charge trap flash (CTF) in which a charge storing layer is configured by a dielectric layer.

A power supply circuit 310 of the memory device 150 may provide word line voltages, for example, a program voltage, a read voltage and a pass voltage, to be supplied to respective word lines according to an operation mode and voltages to be supplied to bulks, for example, well regions in which the memory cells are formed. The power supply circuit 310 may perform a voltage generating operation under the control of a control circuit (not shown). The power supply circuit 310 may generate a plurality of variable read voltages to generate a plurality of read data, select one of the memory blocks or sectors of a memory cell array under the control of the control circuit, select one of the word lines of the selected memory block, and provide the word line voltages to the selected word line and unselected word lines.

A read and write (read/write) circuit 320 of the memory device 150 may be controlled by the control circuit, and may serve as a sense amplifier or a write driver according to an operation mode. During a verification operation or a normal read operation, the read/write circuit 320 may operate as a sense amplifier for reading data from the memory cell array. During a program operation, the read/write circuit 320 may operate as a write driver for driving bit lines according to data to be stored in the memory cell array. During a program operation, the read/write circuit 320 may receive from a buffer (not illustrated) data to be stored into the memory cell array, and drive bit lines according to the received data. The read/write circuit 320 may include a plurality of region buffers 322 to 326 respectively corresponding to columns (or bit lines) or column pairs (or bit line pairs), and each of the region buffers 322 to 326 may include a plurality of latches (not illustrated).

Figure 4:
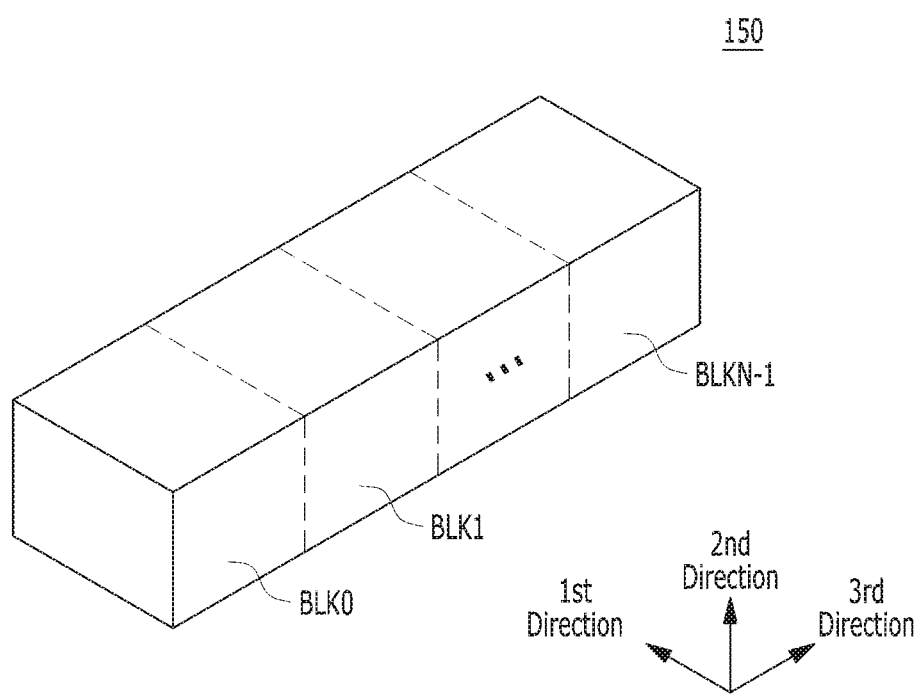
FIG. 4 is a schematic diagram illustrating an exemplary three-dimensional structure of the memory device shown in FIG. 2.

FIG. 4 is a schematic diagram illustrating a 3D structure of the memory device 150.

Although FIG. 4 shows a 3D structure, the memory device 150 may be embodied by a two-dimensional (2D) or three-dimensional (3D) memory device. Specifically, as illustrated in FIG. 4, the memory device 150 may be embodied in a nonvolatile memory device having a 3D stack structure. When the memory device 150 has a 3D structure, the memory device 150 may include a plurality of memory blocks BLK0 to BLKN−1 each having a 3D structure (or a vertical structure).

Figure 5:
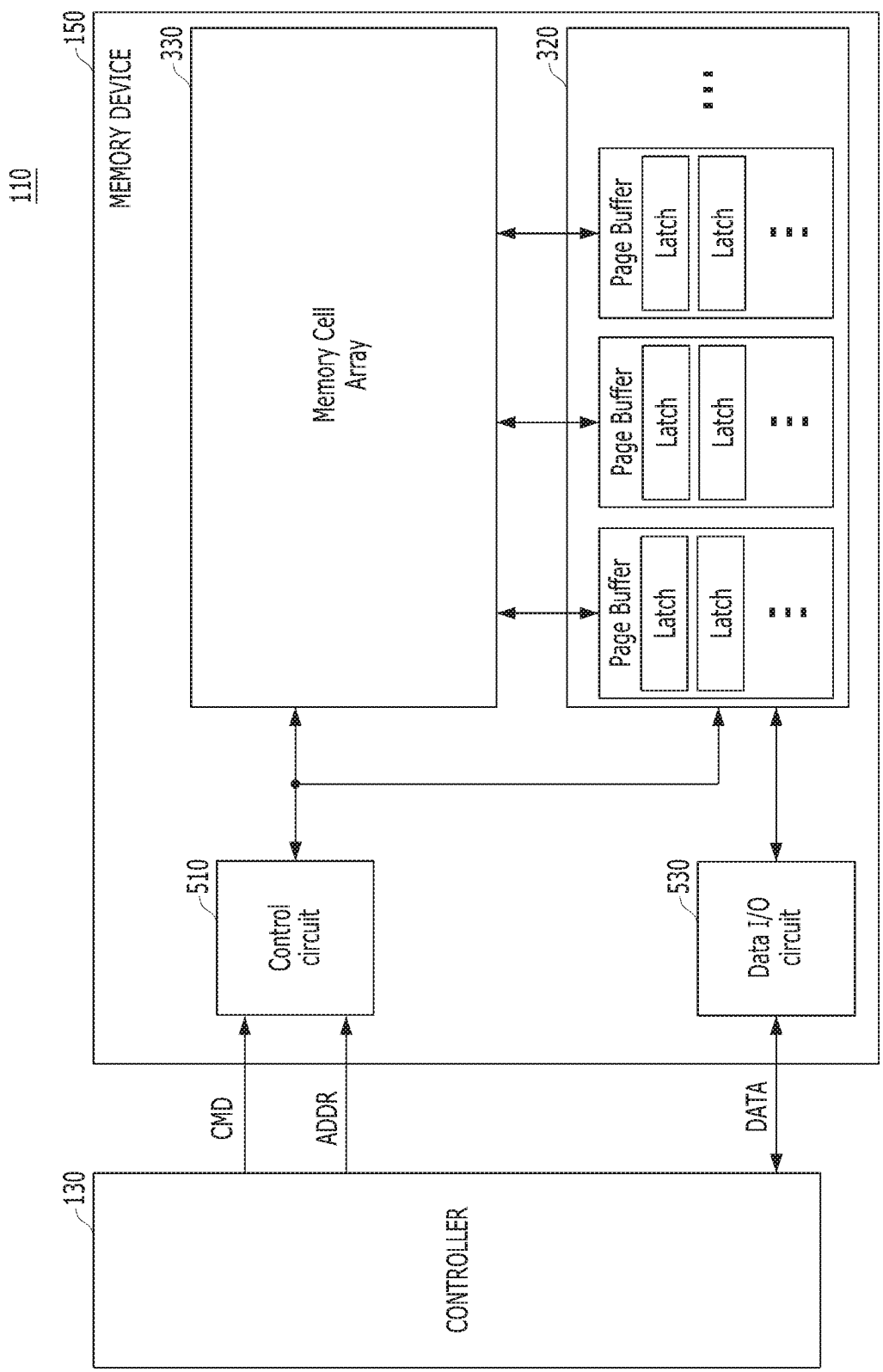
FIG. 5 is a block diagram illustrating a memory system, in accordance with an embodiment of the present disclosure.

FIG. 5 illustrates a memory system 110, in accordance with an embodiment of the present invention.

Referring to FIG. 5, the memory system 110 may include a controller 130 and a memory device 150. The memory device 150 may include a read and write (read/write) circuit 320, a memory cell array 330, a control circuit 510 and a data input/output (I/O) circuit 530. In operation, the controller 130 may provide data DATA, a command CMD and an address ADDR to the memory device 150. The controller 130 may also receive data from the memory device 150 for transferring them to the host 102. (See FIG. 1). The data DATA, command CMD and address ADDR may be transferred via the same or different different I/O buses.

Hereinafter, an operation method according to an embodiment is described. Accordingly, the host 102 of FIG. 1 may issue a read command for target data to the memory system 110. The controller 130 may receive the read command for reading the target data and the address information corresponding to the target data from the host 102. The controller 130 may control the memory device 150 to read the target data based on the received read command and the address information.

For example, the control circuit 510 of the memory device may receive the read command and address information for the target data from the controller 130. The control circuit 510 may control the power supply circuit 310 and the read/write circuit 320 (see FIGS. 3 and 5) for reading the target data based on the received read command and address information. For example, although not illustrated in FIG. 5, the power supply circuit 310 may apply an initial read voltage to a word line and a bit line for reading the target data from a memory cell storing the target data, based on the received address information. The read/write circuit 320 may read the target data using the initial read voltage applied from the power supply circuit 310, based on the read command and the address information. The read/write circuit 320 may store the read target data (hereafter, referred to as read data) in a page buffer included in the read/write circuit 320. Although in the described embodiment, the read/write circuit 320 includes a plurality of page buffers, the invention is not limited in this way. Generally, the read/write circuit 320 may include a plurality of memory region buffers corresponding to a plurality of memory regions. The page buffer may include a plurality of internal latches. The read/write circuit 320 may store the read data in an internal latch of a page buffer in the read/write circuit 320. Then, the data I/O circuit 530 may output the read data stored in the internal latch to the controller 130.

The controller 130 may perform an error correction code (ECC) decoding operation on the read data outputted from the memory device 150. Specifically, although not illustrated in FIG. 5, the ECC unit 138 of FIG. 1 may perform the ECC decoding operation on the read data. At this time, the controller 130 may determine whether the read operation for the target data has been successfully performed, based on ECC-decoded read data (hereafter, referred to as decoded data). When the decoded data satisfies a preset success condition, for example, when the number of error bits for the ECC decoding operation is less than a preset error bit number, the controller 130 may determine that the read operation for the target data has been successfully performed. When the decoded data does not satisfy the preset success condition, for example, when the number of error bits for the ECC decoding operation is greater than or equal to the preset error bit number, the controller 130 may determine that the read operation for the target data has failed. Then, the controller 130 may change the read voltage and control the memory device 150 to reread the target data based on the changed read voltage.

Specifically, the control circuit 510 may receive from the controller 130 a command and address information for rereading the target data for which the read operation failed.

In performing the rereading operation, the control circuit 510 may control the power supply circuit 310 to change the initial read voltage to a read voltage that is different from the initial read voltage. For example, the control circuit 510 may select the read voltage based on a read voltage table. The read voltage table may be stored in the control circuit 510. A plurality of read voltages may be stored in the read voltage table. The plurality of read voltages stored in the read voltage table may have priorities. For example, in various embodiments, first to sixth read voltages may be stored in the read voltage table according to their priorities. The control circuit 510 may control the power supply circuit 310 to sequentially apply the first to sixth read voltages to a memory cell having an address corresponding to the target data based on their priorities. Therefore, the power supply circuit 310 may sequentially apply the first to sixth read voltages to the word line and bit line corresponding to the target data.

The read/write circuit 320 may sequentially read the target data using the first to sixth read voltages which are sequentially applied, and store the read data in the respective latches. For example, when three latches are included in each of the page buffers included in the read/write circuit 320, the read/write circuit 320 may store first read data in a first latch, store second read data in a second latch, and store third read data in a third latch. The first read data is obtained by reading the target data using the first read voltage. The second read data is obtained by reading the target data using the second read voltage. The third read data is obtained by reading the target data using the third read voltage. Then, when the first read data stored in the first latch are outputted to the controller 130 through the data I/O circuit 530, the read/write circuit 320 may store fourth read data in the first latch. The fourth read data is obtained by reading the target data using the fourth read voltage. Based on the same principle, fifth and sixth read data may be stored in the second and third latches, respectively. The operations of reading the read data and storing them in the respective latches of a corresponding page buffer may be performed regardless of the ECC decoding operation performed by the controller 130. That is, while the controller 130 performs the ECC decoding operation on the first read data, the read/write circuit 320 may store the fourth read data in the first latch.

In another example, the control circuit 510 may not employ a read voltage table. For example, the control circuit 510 may sequentially change the read voltage in an ascending or a descending order, and control the power supply circuit 310 to apply the plurality of read voltages to the address corresponding to the target data. That is, the control circuit 510 may control the power supply circuit 310 to apply voltages with a constant difference set therebetween, i.e., without the need for a read voltage table stored in the control circuit 510. As described above, the read/write circuit 320 may store the plurality of voltages in the respective latches.

The controller 130 may load the first read data which are stored in the first latch through the data I/O circuit 530. The controller 130 may then perform the ECC decoding operation on the loaded first read data, and determine whether the first decoded data satisfy the preset success condition.

When the first decoded data satisfied the preset success condition, the controller 130 may end the read operation for the target data, and output the first decoded data to the host 102. Then, the controller 130 may control the memory device 150 to perform a discharge operation on a target page having the target data stored therein, in order to perform the next read operation. Specifically, the controller 130 may transfer a discharge command to the memory device 150, and the control circuit 510 may perform a discharge operation on a target page corresponding to the discharge command. The controller 130 may control the memory device 150 to set the first read voltage to a new read reference voltage.

When the first decoded data does not satisfy the preset success condition, the controller 130 may determine whether to reload read data, based on a preset number of times to repeat the ECC decoding operation (hereafter, referred to as the ECC decoding repetition number). For example, when the ECC decoding repetition number is set to 3 and the ECC decoding operation for the same target data has been performed three times, the controller 130 may not perform another read operation on the target data, but may instead determine that the target data are uncorrectable (also referred to herein as ECC uncorrectable data or simply as uncorrectable ECC (UECC)). On the other hand, when the number of repeated ECC decoding operations did not reach the ECC decoding repetition number, the controller 130 may load read data from another latch instead of the latch from which the target data were loaded, and perform the ECC decoding operation again.

Unlike the above-described example, when the plurality of voltages written in the read voltage table are all used although the number of repeated ECC decoding operations reaches the ECC decoding repetition number, the controller 130 may not perform the read operation on the target data, but determine that the target data are a UECC. Then, the controller 130 may control the memory device 150 to perform a discharge operation on the target memory region such as, for example, a page.

The read operation in accordance with the present embodiment has been described based on the read operation which is performed after the initial read operation for reading the target data using the initial voltage has failed. However, this is only an example, and the present embodiment is not limited thereto. In the present embodiment, after controlling the memory device 150 to read the target data using the initial read data, the controller 130 may control the memory device 150 to read the target data using the plurality of read voltages written in the read voltage table. Unlike the above-described configuration, the controller 130 may control the memory device 150 to directly read the target data using the plurality of read voltages written in the read voltage table, without utilizing the initial read voltage.

Figure 6:
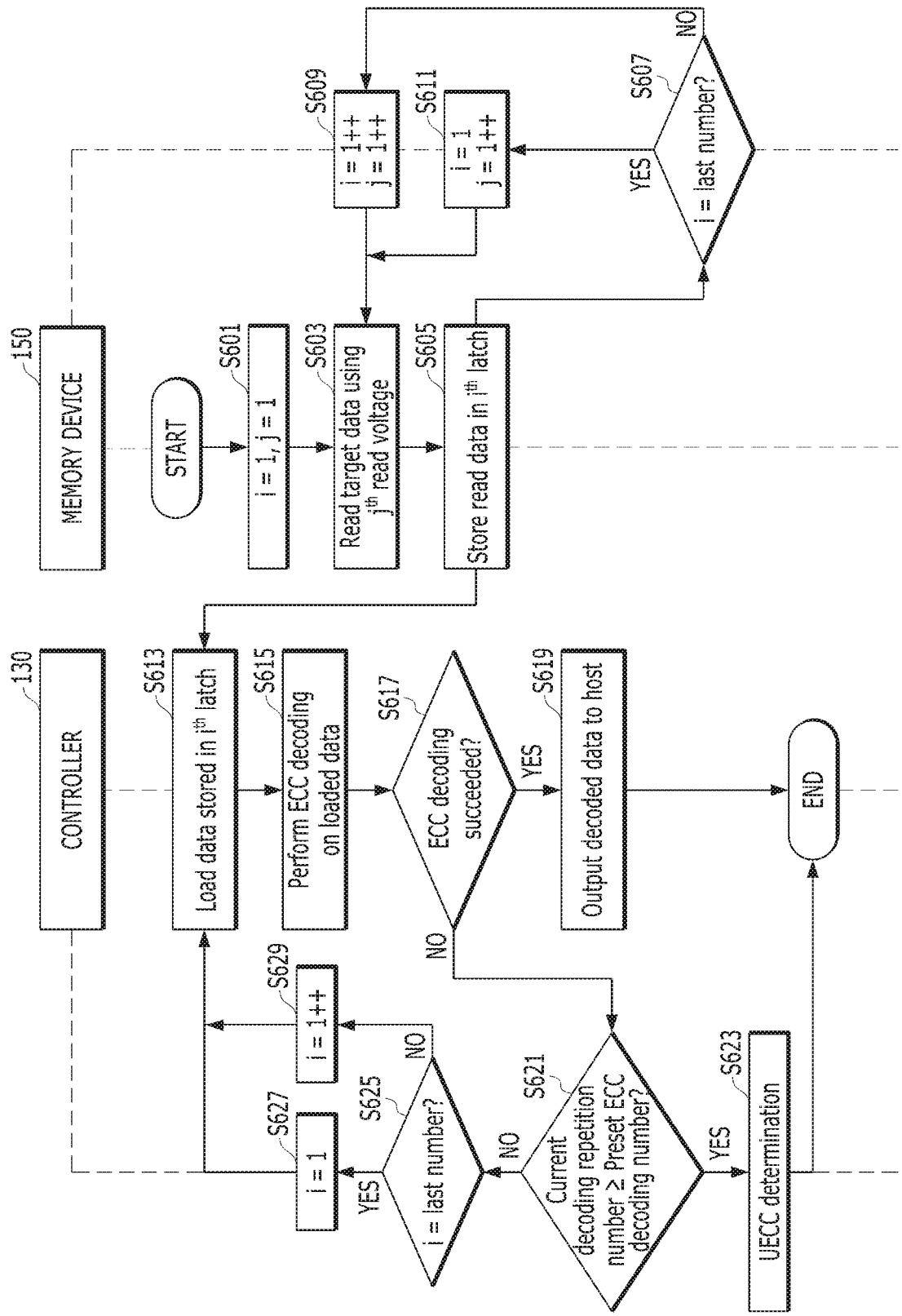
FIG. 6 is a flowchart illustrating a method of operation of a memory system, in accordance with an embodiment of the present disclosure.

FIG. 6 is a flowchart illustrating a method of operation of a memory system, for example, the memory system 110 of FIG. 5 in accordance with an embodiment. Hereafter, it is supposed that the initial read operation for the target data has failed, and a read operation for the target data is performed again. Furthermore, it is supposed that the read voltage table is stored in the control circuit 510 of FIG. 5.

At step S601, the initial values of the number i of a latch to store read data and the number j of a read voltage written in the read voltage table may be set.

At step S603, the control circuit 510 may control the power supply circuit 310 to apply the jth read voltage based on the read voltage table. The read/write circuit 320 may read the target data based on the applied jth read voltage.

At step S605, the read/write circuit 320 may store the ith read data in the ith latch.

At step S607, the control circuit 510 may determine whether the ith latch is the latch with the last number in a page buffer which corresponds to the target page having the target data stored therein.

When the ith latch is not the latch with the last number in the page buffer (NO at step S607), '1' may be added to the values of i and j at step S609. Then, the control circuit 510 may perform steps S603 to S605 based on the values of i and j at step S609.

When the ith latch is the latch with the last number in the page buffer (YES at step S607), the value of i may be set '1', and the value of j may be set to a value obtained by adding to the previous value of j, at step S611. Then, the control circuit 510 may perform steps S603 to S605 based on the values of i and j at step S611.

At step S613, the controller 130 may load the read data stored in the ith latch through the data I/O circuit 530, regardless of whether the operations of steps S607 to S611 are performed in the memory device 150.

At step S615, the controller 130 may perform the ECC decoding operation on the loaded data.

At step S617, the controller 130 may determine whether the ECC decoding operation on the decoded data satisfies the preset success condition. In other words, the controller 130 may determine whether the ECC decoding operation succeeded.

When the ECC decoding operation satisfies the preset success condition (YES at step S617), the controller 130 may output the decoded data to the host 102 at step S619. Although not illustrated, the controller 130 may control the memory device 150 to perform a discharge operation on the target page having the target data stored therein, in order to perform the next read operation. Furthermore, the controller 130 may control the memory device 150 to set the read voltage to a new read reference voltage. The read voltage has been used when the read data corresponding to the decoded data are read.

When the ECC decoding operation does not satisfy the preset success condition (NO at step S617), the controller 130 may determine whether to reload the read data, based on the preset ECC decoding repetition number at step S621. The controller 130 may determine whether to reload the read data by comparing the number of current repeated ECC decoding operations with the preset ECC decoding repetition number.

When the number of repeated ECC decoding operations is greater than or equal to the preset ECC decoding repetition number (YES at step S621), the controller 130 may determine that the target data are an uncorrectable ECC (UECC), at step S623.

When the number of repeated ECC decoding operations is less than the preset ECC decoding repetition number (NO at step S621), the controller 130 may determine whether the ith latch is the latch with the last number in the region buffer which corresponds to the target page having the target data stored therein, at step S625. In other words, the controller 130 may determine whether i is the last number.

When the ith latch is the latch with the last number in the region buffer (YES at step S625), the value of i may be set to '1' at step S627. Then, the controller 130 may perform steps S613 to S617 based on the value of i at step S627.

When the ith latch is not the latch with the last number in the page buffer (NO at step S625), the value of i may be set to a value obtained by adding '1' to the previous value of i at step S629. Then, the controller 130 may perform steps S613 to S617 based on the value of i at step S629.

As described above, the memory system 110 in accordance with the present embodiment may efficiently perform the read operation.

Hereinafter, a data processing system and electronic devices which may be constituted with the memory system 110 including the memory device 150 and the controller 130, which are described above by referring to FIGS. 1 to 6, will be described in detail with reference to FIGS. 7 to 15.

FIGS. 7 to 15 are diagrams schematically illustrating application examples of the data processing system of FIGS. 1 to 6 according to various embodiments.

Figure 7:
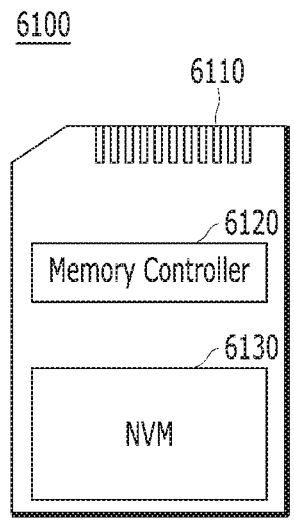
FIGS. 7 to 15 are diagrams schematically illustrating application examples of a data processing system, in accordance with various embodiments of the present invention.

FIG. 7 is a diagram schematically illustrating an example of the data processing system including the memory system in accordance with an embodiment. FIG. 7 schematically illustrates a memory card system 6100 including the memory system in accordance with an embodiment.

Referring to FIG. 7, the memory card system 6100 may include a memory controller 6120, a memory device 6130 and a connector 6110.

More specifically, the memory controller 6120 may be connected to the memory device 6130, and may be configured to access the memory device 6130. The memory device 6130 may be embodied by a nonvolatile memory (NVM). By the way of example but not limitation, the memory controller 6120 may be configured to control read, write, erase and background operations onto the memory device 6130. The memory controller 6120 may be configured to provide an interface between the memory device 6130 and a host (not shown) and/or a drive firmware for controlling the memory device 6130. That is, the memory controller 6120 may correspond to the controller 130 in the memory system 110 described with reference to FIGS. 1 to 6, while the memory device 6130 may correspond to the memory device 150 described with reference to FIGS. 1 to 6.

Thus, as shown in FIG. 1, the memory controller 6120 may include a random access memory (RAM), a processing unit, a host interface, a memory interface and an error correction unit. The memory controller 130 may further include the elements described in FIG. 1.

The memory controller 6120 may communicate with an external device, for example, the host 102 of FIG. 1 through the connector 6110. For example, as described with reference to FIG. 1, the memory controller 6120 may be configured to communicate with an external device through one or more of various communication protocols such as universal serial bus (USB), multimedia card (MMC), embedded MMC (eMMC), peripheral component interconnection (PCI), PCI express (PCIe), Advanced Technology Attachment (ATA), Serial-ATA, Parallel-ATA, small computer system interface (SCSI), enhanced small disk interface (EDSI), Integrated Drive Electronics (IDE), Firewire, universal flash storage (UFS), wireless fidelity (Wi-Fi or WiFi) and Bluetooth. Thus, the memory system and the data processing system in accordance with an embodiment may be applied to wired and/or wireless electronic devices or particularly mobile electronic devices.

The memory device 6130 may be implemented by a nonvolatile memory. For example, the memory device 6130 may be implemented by various nonvolatile memory devices such as an erasable and programmable ROM (EPROM), an electrically erasable and programmable ROM (EEPROM), a NAND flash memory, a NOR flash memory, a phase-change RAM (PRAM), a resistive RAM (ReRAM), a ferroelectric RAM (FRAM) and a spin torque transfer magnetic RAM (STT-RAM). The memory device 6130 may include a plurality of dies as in the memory device 150 of FIG. 1.

The memory controller 6120 and the memory device 6130 may be integrated into a single semiconductor device. For example, the memory controller 6120 and the memory device 6130 may construct a solid state driver (SSD) by being integrated into a single semiconductor device. Also, the memory controller 6120 and the memory device 6130 may construct a memory card such as a PC card (e.g., Personal Computer Memory Card International Association (PCMCIA)), a compact flash (CF) card, a smart media card (e.g., SM and SMC), a memory stick, a multimedia card (e.g., MMC, RS-MMC, MMCmicro and eMMC), a secured digital (SD) card (e.g., SD, miniSD, microSD and SDHC) and a universal flash storage (UFS).

Figure 8:
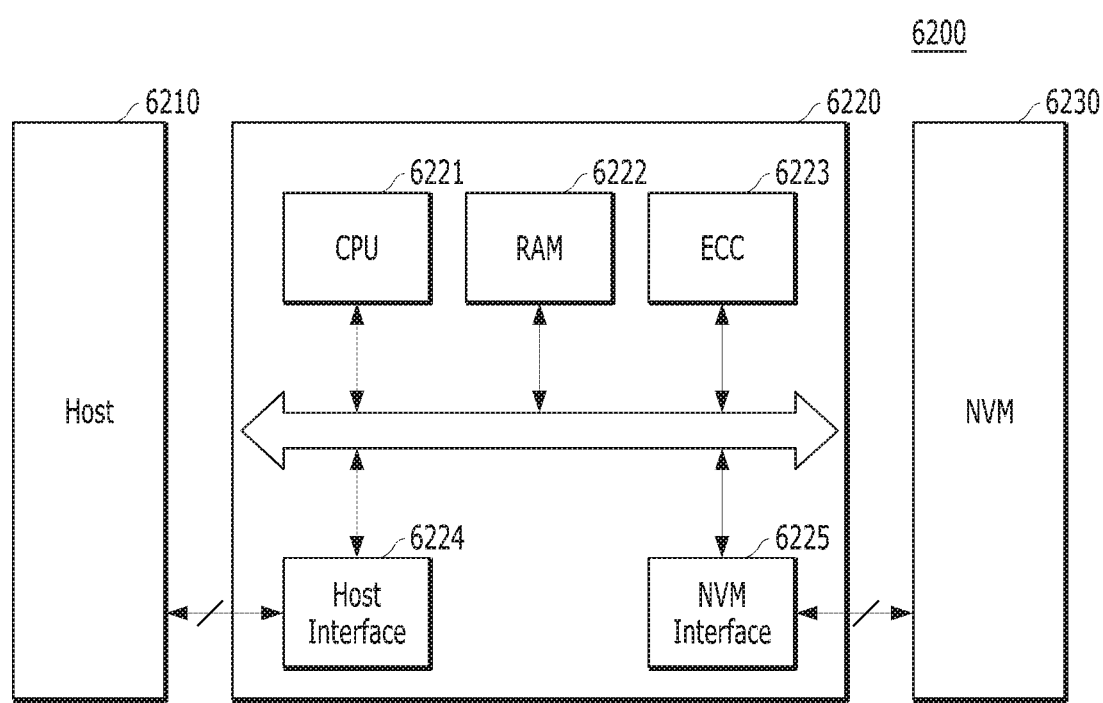

FIG. 8 is a diagram schematically illustrating another example of a data processing system 6200 including a memory system, in accordance with an embodiment.

Referring to FIG. 8, the data processing system 6200 may include a memory device 6230 having one or more nonvolatile memories (NVMs) and a memory controller 6220 for controlling the memory device 6230. The data processing system 6200 may serve as a storage medium such as a memory card (CF, SD, micro-SD or the like) or USB device, as described with reference to FIG. 1. The memory device 6230 may correspond to the memory device 150 in the memory system 110 described in FIGS. 1 to 6, and the memory controller 6220 may correspond to the controller 130 in the memory system 110 described in FIGS. 1 to 6.

The memory controller 6220 may control a read, write, or erase operation on the memory device 6230 in response to a request of the host 6210, and the memory controller 6220 may include one or more central processing units (CPUs) 6221, a buffer memory such as a random access memory (RAM) 6222, an error correction code (ECC) circuit 6223, a host interface 6224 and a memory interface such as an NVM interface 6225.

The CPU 6221 may control the operations on the memory device 6230, for example, read, write, file system management and bad page management operations. The RAM 6222 may be operated according to control of the CPU 6221, and used as a work memory, buffer memory or cache memory. When the RAM 6222 is used as a work memory, data processed by the CPU 6221 may be temporarily stored in the RAM 6222. When the RAM 6222 is used as a buffer memory, the RAM 6222 may be used for buffering data transmitted to the memory device 6230 from the host 6210 or transmitted to the host 6210 from the memory device 6230. When the RAM 6222 is used as a cache memory, the RAM 6222 may assist the memory device 6230 to operate at high speed.

The ECC circuit 6223 may correspond to the ECC unit 138 of the controller 130 illustrated in FIG. 1. As described with reference to FIG. 1, the ECC circuit 6223 may generate an error correction code (ECC) for correcting a fail bit or error bit of data provided from the memory device 6230. The ECC circuit 6223 may perform error correction encoding on data provided to the memory device 6230, thereby forming data with a parity bit. The parity bit may be stored in the memory device 6230. The ECC circuit 6223 may perform error correction decoding on data outputted from the memory device 6230. in this case, the ECC circuit 6223 may correct an error using the parity bit. For example, as described with reference to FIG. 1, the ECC circuit 6223 may correct an error using Low Density Parity Check (LDDC) code, Bose-Chaudhri-Hocquenghem (BCH) code, turbo code, Reed-Solomon code, convolution code, Recursive Systematic Code (RSC) or coded modulation such as Trellis-Coded Modulation (TCM) or Block coded modulation (BCM).

The memory controller 6220 may transmit to, and/or receive from, the host 6210 data or signals through the host interface 6224, and may transmit to, and/or receive from, the memory device 6230 data or signals through the NVM interface 6225. The host interface 6224 may be connected to the host 6210 through a parallel advanced technology attachment (DATA) bus, a serial advanced technology attachment (SATA) bus, a small computer system interface (SCSI), a universal serial bus (USB), a peripheral component interconnect-express (PCIe), or a NAND interface. The memory controller 6220 may have a wireless communication function with a mobile communication protocol such as wireless fidelity (WiFi) or Long Term Evolution (LTE). The memory controller 6220 may be connected to an external device, e.g., the host 6210, or another external device, and then transmit and/or receive data to and/or from the external device. As the memory controller 6220 is configured to communicate with the external device through one or more of various communication protocols, the memory system and the data processing system in accordance with an embodiment may be applied to wired and/or wireless electronic devices or particularly a mobile electronic device.

Figure 9:
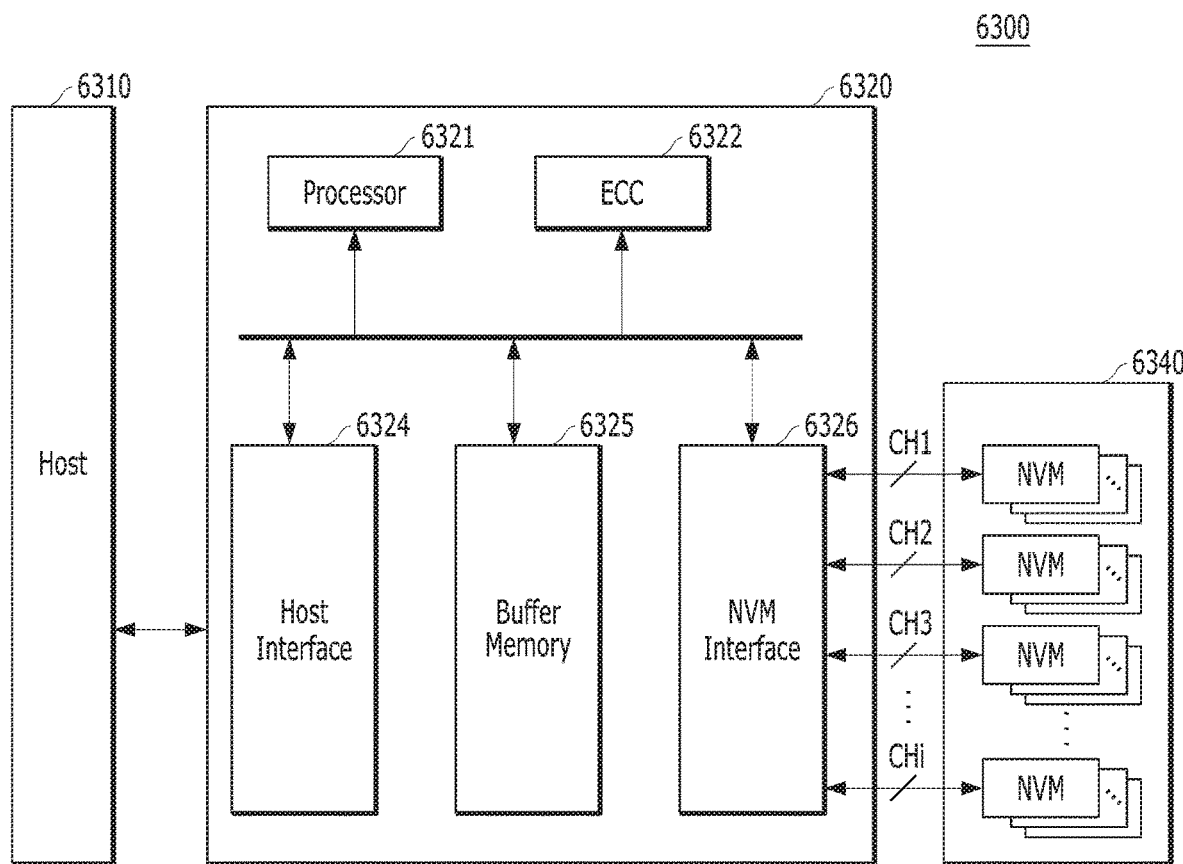

FIG. 9 is a diagram schematically illustrating another example of the data processing system including the memory system in accordance with an embodiment. FIG. 9 schematically illustrates a solid state drive (SSD) to which the memory system in accordance with an embodiment is applied.

Referring to FIG. 9, the SSD 6300 may include a controller 6320 and a memory device 6340 including a plurality of nonvolatile memories (NVMs). The controller 6320 may correspond to the controller 130 in the memory system 110 of FIG. 1, and the memory device 6340 may correspond to the memory device 150 in the memory system of FIG. 1.

More specifically, the controller 6320 may be connected to the memory device 6340 through a plurality of channels CH1 to CHi. The controller 6320 may include one or more processors 6321, an error correction code (ECC) circuit 6322, a host interface 6324, a buffer memory 6325 and a memory interface, for example, a nonvolatile memory interface 6326.

The buffer memory 6325 may temporarily store data provided from the host 6310 or data provided from a plurality of flash memories NVM included in the memory device 6340, or temporarily store meta data of the plurality of flash memories NVM, for example, map data including a mapping table. The buffer memory 6325 may be embodied by volatile memories such as a dynamic random access memory (DRAM), a synchronous DRAM (SDRAM), a double data rate (DDR) SDRAM, a low power DDR (LPDDR) SDRAM and a graphics RAM (GRAM) or non-volatile memories such as a ferroelectric RAM (FRAM), a resistive RAM (RRAM or ReRAM), a spin-transfer torque magnetic RAM (STT-MRAM) and a phase-change RAM (PRAM). For the purpose of description, FIG. 9 illustrates that the buffer memory 6325 exists in the controller 6320, but the buffer memory 6325 may be located or arranged outside the controller 6320.

The ECC circuit 6322 may calculate an error correction code (ECC) value of data to be programmed to the memory device 6340 during a program operation, perform an error correction operation on data read from the memory device 6340 based on the ECC value during a read operation, and perform an error correction operation on data recovered from the memory device 6340 during a failed data recovery operation.

The host interface 6324 may provide an interface function with an external device, for example, the host 6310, and the nonvolatile memory interface 6326 may provide an interface function with the memory device 6340 connected through the plurality of channels.

Furthermore, a plurality of SSDs 6300 to which the memory system 110 of FIG. 1 is applied may be provided to embody a data processing system, for example, a redundant array of independent disks (RAID) system. The RAID system may include the plurality of SSDs 6300 and a RAID controller for controlling the plurality of SSDs 6300. When the RAID controller performs a program operation in response to a write command provided from the host 6310, the RAID controller may select one or more memory systems or SSDs 6300 according to a plurality of RAID levels, i.e., RAID level information of the write command provided from the host 6310 in the SSDs 6300, and may output data corresponding to the write command to the selected SSDs 6300. Furthermore, when the RAID controller performs a read command in response to a read command provided from the host 6310, the RAID controller may select one or more memory systems or SSDs 6300 according to a plurality of RAID levels, that is, RAID level information of the read command provided from the host 6310 in the SSDs 6300, and provide data read from the selected SSDs 6300 to the host 6310.

Figure 10:
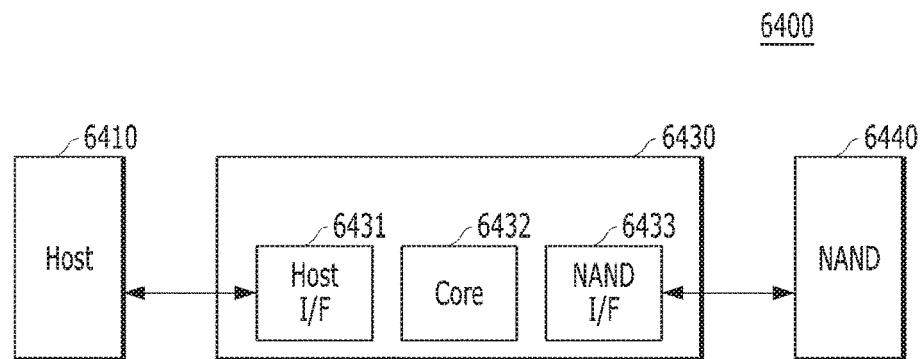

FIG. 10 is a diagram schematically illustrating another example of the data processing system including the memory system in accordance with an embodiment. FIG. 10 schematically illustrates an embedded Multi-Media Card (eMMC) 6400 to which the memory system in accordance with an embodiment is applied.

Referring to FIG. 10, the eMMC 6400 may include a controller 6430 and a memory device 6440 embodied by one or more NAND flash memories. The controller 6430 may correspond to the controller 130 in the memory system 110 of FIG. 1, and the memory device 6440 may correspond to the memory device 150 in the memory system 110 of FIG. 1.

More specifically, the controller 6430 may be connected to the memory device 6440 through a plurality of channels. The controller 6430 may include one or more cores 6432, a host interface (I/F) 6431 and a memory interface, for example, a NAND interface (I/F) 6433.

The core 6432 may control the operations of the eMMC 6400, the host interface 6431 may provide an interface function between the controller 6430 and the host 6410. The NAND interface 6433 may provide an interface function between the memory device 6440 and the controller 6430. For example, the host interface 6431 may serve as a parallel interface, for example, MMC interface as described with reference to FIG. 1. Furthermore, the host interface 6431 may serve as a serial interface, for example, Ultra High Speed (UHS)-I and UHS-II interface.

FIGS. 11 to 14 are diagrams schematically illustrating other examples of the data processing system including the memory system in accordance with an embodiment. FIGS. 11 to 14 schematically illustrate universal flash storage (UFS) systems to which the memory system in accordance with an embodiment is applied.

Referring to FIGS. 11 to 14, the UFS systems 6500, 6600, 6700 and 6800 may include hosts 6510, 6610, 6710, 6810, UFS devices 6520, 6620, 6720, 6820 and UFS cards 6530, 6630, 6730, 6830, respectively. The hosts 6510, 6610, 6710, 6810 may serve as application processors of wired and/or wireless electronic devices or particularly mobile electronic devices, the UFS devices 6520, 6620, 6720, 6820 may serve as embedded UFS devices. The UFS cards 6530, 6630, 6730, 6830 may serve as external embedded UFS devices or removable UFS cards.

The hosts 6510, 6610, 6710, 6810, the UFS devices 6520, 6620, 6720, 6820 and the UFS cards 6530, 6630, 6730, 6830 in the respective UFS systems 6500, 6600, 6700 and 6800 may communicate with external devices, e.g., wired and/or wireless electronic devices or particularly mobile electronic devices through UFS protocols. The UFS devices 6520, 6620, 6720, 6820 and the UFS cards 6530, 6630, 6730, 6830 may be embodied by the memory system 110 illustrated in FIG. 1. For example, in the UFS systems 6500, 6600, 6700, 6800, the UFS devices 6520, 6620, 6720, 6820 may be embodied in the form of the data processing system 6200, the SSD 6300 or the eMMC 6400 described with reference to FIGS. 8 to 10, and the UFS cards 6530, 6630, 6730, 6830 may be embodied in the form of the memory card system 6100 described with reference to FIG. 7.

Furthermore, in the UFS systems 6500, 6600, 6700 and 6800, the hosts 6510, 6610, 6710, 6810, the UFS devices 6520, 6620, 6720, 6820 and the UFS cards 6530, 6630, 6730, 6830 may communicate with each other through an UFS interface, for example, MIPI M-PHY and MIPI UniPro (Unified Protocol) in MIPI (Mobile Industry Processor Interface). Furthermore, the UFS devices 6520, 6620, 6720, 6820 and the UFS cards 6530, 6630, 6730, 6830 may communicate with each other through various protocols other than the UFS protocol, e.g., universal storage bus (USB) Flash Drives (UFDs), multi-media card (MMC), secure digital (SD), mini-SD, and micro-SD.

Figure 11:
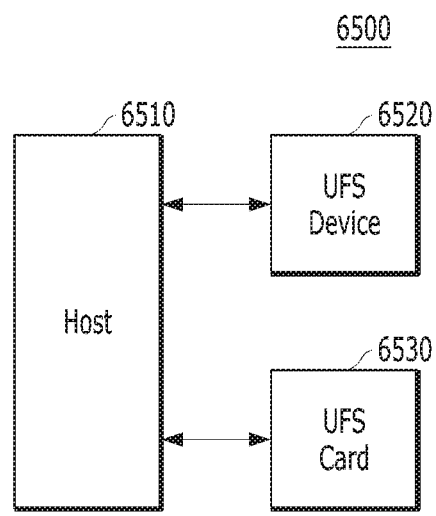

In the UFS system 6500 illustrated in FIG. 11, each of the host 6510, the UFS device 6520 and the UFS card 6530 may include UniPro. The host 6510 may perform a switching operation to communicate with at least one of the UFS device 6520 and the UFS card 6530. The host 6510 may communicate with the UFS device 6520 or the UFS card 6530 through link layer switching, e.g., L3 switching at the UniPro. In this case, the UFS device 6520 and the UFS card 6530 may communicate with each other through a link layer switching at the UniPro of the host 6510. In an example, the configuration in which one UFS device 6520 and one UFS card 6530 are connected to the host 6510 has been exemplified for convenience of description. However, a plurality of UFS devices and UFS cards may be connected in parallel or in the form of a star to the host 6510, and a plurality of UFS cards may be connected in parallel or in the form of a star to the UFS device 6520 or connected in series or in the form of a chain to the UFS device 6520. Herein, the form of a star means an arrangement that a single device is coupled with plural other devices or cards for centralized control.

Figure 12:
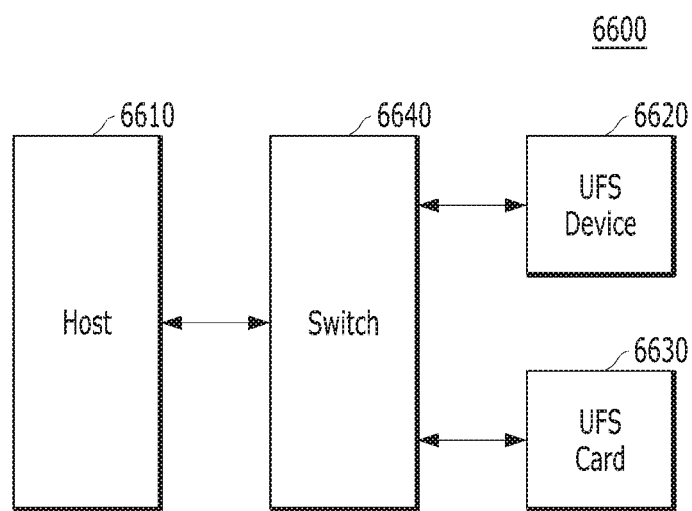

In the UFS system 6600 illustrated in FIG. 12, each of the host 6610, the UFS device 6620 and the UFS card 6630 may include UniPro, and the host 6610 may communicate with the UFS device 6620 or the UFS card 6630 through a switching module 6640 performing a switching operation, for example, through the switching module 6640 which performs link layer switching at the UniPro, for example, L3 switching.

The UFS device 6620 and the UFS card 6630 may communicate with each other through link layer switching of the switching module 6640 at UniPro. In an example, the configuration in which one UFS device 6620 and one UFS card 6630 are connected to the switching module 6640 has been exemplified for convenience of description. However, a plurality of UFS devices and UFS cards may be connected in parallel or in the form of a star to the switching module 6640, and a plurality of UFS cards may be connected in series or in the form of a chain to the UFS device 6620.

Figure 13:
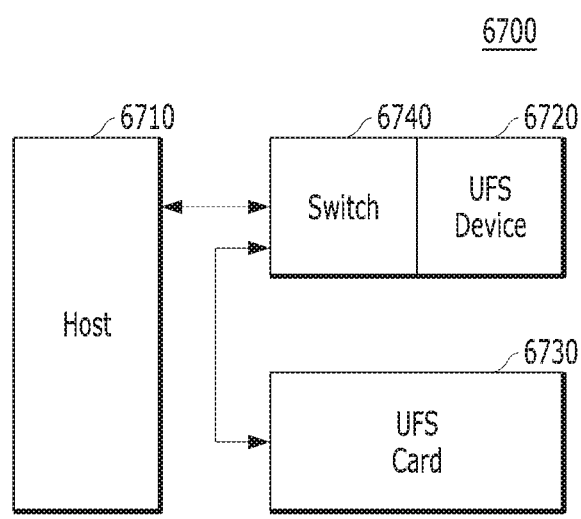

In the UFS system 6700 illustrated in FIG. 13, each of the host 6710, the UFS device 6720 and the UFS card 6730 may include UniPro. The host 6710 may communicate with the UFS device 6720 or the UFS card 6730 through a switching module 6740 performing a switching operation, for example, the switching module 6740 which performs link layer switching at the UniPro, for example, L3 switching. In this case, the UFS device 6720 and the UFS card 6730 may communicate with each other through link layer switching of the switching module 6740 at the UniPro, and the switching module 6740 may be integrated as one module with the UFS device 6720 inside or outside the UFS device 6720. In an example, the configuration in which one UFS device 6720 and one UFS card 6730 are connected to the switching module 6740 has been exemplified for convenience of description. However, a plurality of modules each including the switching module 6740 and the UFS device 6720 may be connected in parallel or in the form of a star to the host 6710 or connected in series or in the form of a chain to each other. Furthermore, a plurality of UFS cards may be connected in parallel or in the form of a star to the UFS device 6720.

Figure 14:
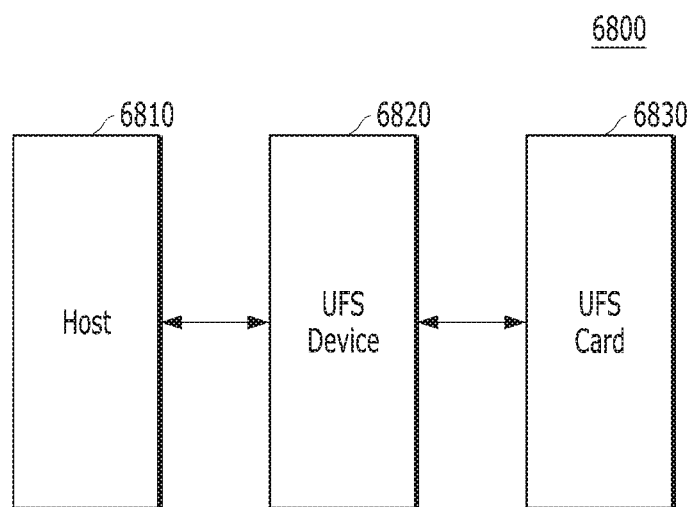

In the UFS system 6800 illustrated in FIG. 14, each of the host 6810, the UFS device 6820 and the UFS card 6830 may include M-PHY and UniPro. The UFS device 6820 may perform a switching operation to communicate with the host 6810 and the UFS card 6830. The UFS device 6820 may communicate with the host 6810 or the UFS card 6830 through a switching operation between the M-PHY and UniPro module for communication with the host 6810 and the M-PHY and UniPro module for communication with the UFS card 6830, for example, through a target Identifier (ID) switching operation. Here, the host 6810 and the UFS card 6830 may communicate with each other through target ID switching between the M-PHY and UniPro modules of the UFS device 6820. In an embodiment, the configuration in which one UFS device 6820 is connected to the host 6810 and one UFS card 6830 is connected to the UFS device 6820 has been exemplified for convenience of description. However, a plurality of UFS devices may be connected in parallel or in the form of a star to the host 6810, or connected in series or in the form of a chain to the host 6810, and a plurality of UFS cards may be connected in parallel or in the form of a star to the UFS device 6820, or connected in series or in the form of a chain to the UFS device 6820.

Figure 15:
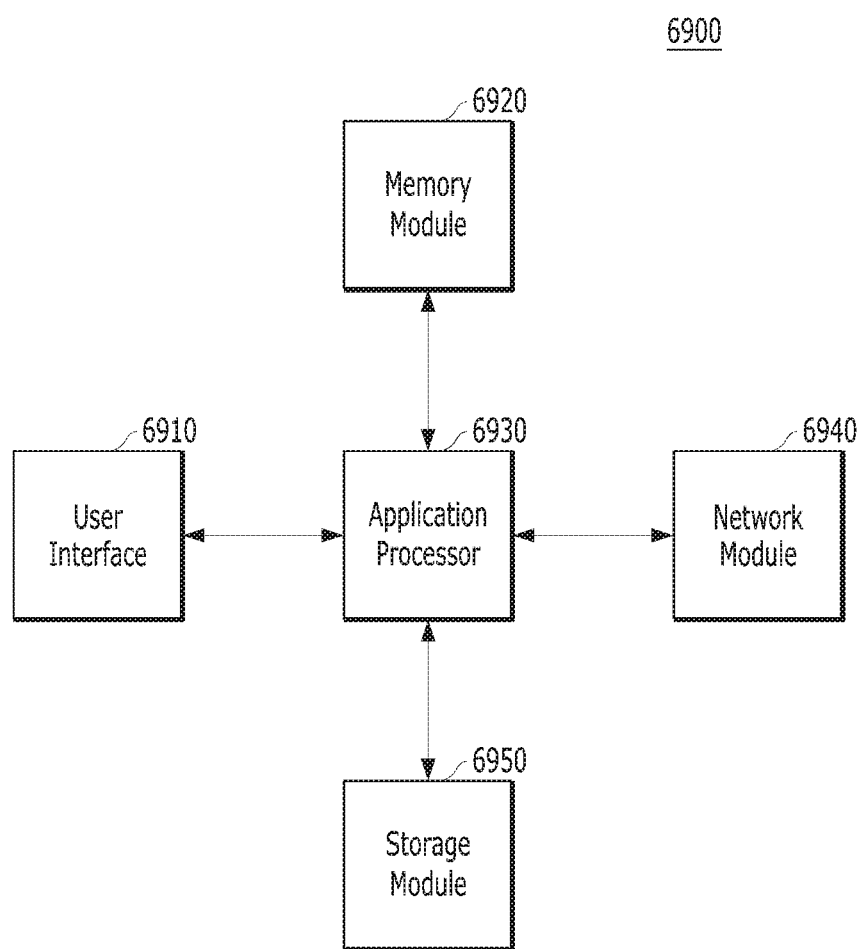

FIG. 15 is a diagram schematically illustrating another example of the data processing system including the memory system in accordance with an embodiment. FIG. 15 is a diagram schematically illustrating a user system 6900 to which the memory system in accordance with an embodiment is applied.

Referring to FIG. 15, the user system 6900 may include a user interface 6910, a memory module 6920, an application processor 6930, a network module 6940, and a storage module 6950.

More specifically, the application processor 6930 may drive components included in the user system 6900, for example, an operating system (OS), and include controllers, interfaces and a graphic engine which control the components included in the user system 6900. The application processor 6930 may be provided as a System-on-Chip (SoC).

The memory module 6920 may be used as a main memory, work memory, buffer memory or cache memory of the user system 6900. The memory module 6920 may include a volatile random access memory (RAM) such as a dynamic RAM (DRAM), a synchronous DRAM (SDRAM), a double data rate (DDR) SDRAM, DDR2 SDRAM, DDR3 SDRAM, LPDDR SDARM, LPDDR3 SDRAM or LPDDR3 SDRAM or a nonvolatile RAM such as a phase-change RAM (PRAM), a resistive RAM (ReRAM), a magneto-resistive RAM (MRAM) or a ferroelectric RAM (FRAM). For example, the application processor 6930 and the memory module 6920 may be packaged and mounted, based on Package on Package (PoP).

The network module 6940 may communicate with external devices. For example, the network module 6940 may not only support wired communication, but may also support various wireless communication protocols such as code division multiple access (CDMA), global system for mobile communication (GSM), wideband CDMA (WCDMA), CDMA-2000, time division multiple access (TDMA), long term evolution (LTE), worldwide interoperability for microwave access (Wimax), wireless local area network (WLAN), ultra-wideband (UWB), Bluetooth, wireless display (WI-DI), thereby communicating with wired/wireless electronic devices or particularly mobile electronic devices. Therefore, the memory system and the data processing system, in accordance with an embodiment of the present invention, can be applied to wired/wireless electronic devices. The network module 6940 may be included in the application processor 6930.

The storage module 6950 may store data, for example, data received from the application processor 6930, and then may transmit the stored data to the application processor 6930. The storage module 6950 may be embodied by a nonvolatile semiconductor memory device such as a phase-change RAM (PRAM), a magnetic RAM (MRAM), a resistive RAM (ReRAM), a NAND flash, NOR flash and 3D NAND flash, and provided as a removable storage medium such as a memory card or external drive of the user system 6900. The storage module 6950 may correspond to the memory system 110 described with reference to FIG. 1. Furthermore, the storage module 6950 may be embodied as an SSD, eMMC and UFS as described above with reference to FIGS. 7 to 14.

The user interface 6910 may include interfaces for inputting data or commands to the application processor 6930 or outputting data to an external device. For example, the user interface 6910 may include user input interfaces such as a keyboard, a keypad, a button, a touch panel, a touch screen, a touch pad, a touch ball, a camera, a microphone, a gyroscope sensor, a vibration sensor and a piezoelectric element, and user output interfaces such as a liquid crystal display (LCD), an organic light emitting diode (OLED) display device, an active matrix OLED (AMOLED) display device, an LED, a speaker and a motor.

Furthermore, when the memory system 110 of FIG. 1 is applied to a mobile electronic device of the user system 6900, the application processor 6930 may control the operations of the mobile electronic device, and the network module 6940 may serve as a communication module for controlling wired and/or wireless communication with an external device. The user interface 6910 may display data processed by the processor 6930 on a display and touch module of the mobile electronic device, or support a function of receiving data from the touch panel.

While the present invention has been described with respect to specific embodiments, it will be apparent to those skilled in the art that various changes and modifications may be made without departing from the spirit and scope of the invention as determined in the following claims.

What is claimed is:

1. An operating method of a memory system, comprising:
reading target data stored in a target memory page, using a plurality of read voltages having different levels, respectively;
sequentially storing first and second read data, which correspond to the target data read with different-level read voltages among the plurality of read voltages, in a plurality of latches including a first latch and a second latch, respectively;
performing a first error correction code (ECC) decoding operation on the first read data stored in the first latch and storing third read data, which corresponds to the target data read with a different-level read voltage among the plurality of read voltages, in the first latch while the first ECC decoding operation is performed; and
performing a second ECC decoding operation on the second read data stored in the second latch, when the first ECC decoding operation fails and a number of repeated ECC decoding operations including the first ECC decoding operation and the second ECC decoding operation is less than a preset ECC decoding repetition number.

2. The operating method of claim 1, wherein the reading of the target data comprises reading the target data using the plurality of read voltages written in a read voltage table stored in a control circuit.

3. The operating method of claim 1, further comprising determining that the target data is uncorrectable, when the number of repeated ECC decoding operations is greater than or equal to the preset ECC decoding repetition number.

4. The operating method of claim 1, further comprising:
performing a discharge operation on the target page, when the second ECC decoding operation succeeds; and
outputting the second read data to a host.

5. The operating method of claim 1, further comprising:
reading the target data using a preset initial read voltage;
storing initial read data corresponding to the target data in any one of the plurality of latches; and
performing an initial ECC decoding operation on the initial read data; and
controlling, by a controller, a memory device to read the target data using the respective read voltages, when the initial ECC decoding operation fails.

6. The operating method of claim 1, further comprising:
loading the first read data stored in the first latch; and
loading the second read data stored in the second latch.

7. A memory system comprising:
a memory device comprising:
a read/write circuit comprising a plurality of latches in a page buffer; and
a control circuit suitable for controlling the read/write circuit to read the target data stored in a target memory page using a plurality of read voltages having different levels, respectively, and to sequentially store first and second read data which correspond to the target data read with different-level read voltages among the plurality of read voltages, in a plurality of latches including a first latch and a second latch, respectively; and
a controller suitable for performing a first ECC decoding operation on the first read data stored in the first latch and storing third read data, which corresponds to the target data read with a different-level read voltage among the plurality of read voltages, in the first latch while the first ECC decoding operation is performed, and performing a second ECC decoding operation on the second read data stored in the second latch, when the first ECC decoding operation fails and a current number of repeated ECC decoding operations including the first ECC decoding operation and the second ECC decoding operation is less than a preset ECC decoding repetition number.

8. The memory system of claim 7, wherein the control circuit controls the read/write circuit to read the target data, using the plurality of read voltages written in a read voltage table stored in the control circuit.

9. The memory system of claim 7, wherein the controller determines that the target data is an uncorrectable ECC (UECC) error, when the number of repeated ECC decoding operations is greater than or equal to the preset ECC decoding repetition number.

10. The memory system of claim 7, wherein when the second ECC decoding operation succeeds, the controller controls the memory device to perform a discharge operation on the target page, and outputs the second read data to a host.

11. The memory system of claim 7, wherein the control circuit controls the read/write circuit to read the target data using a preset initial read voltage, and to store initial read data corresponding to the target data in any one of the plurality of latches, and
wherein the controller performs an initial ECC decoding operation on the initial read data, and controls the memory device to read the target data using the respective read voltages, when the initial ECC decoding operation fails.

12. The memory system of claim 7, wherein the controller loads the first read data stored in the first latch, and loads the second read data stored in the second latch.

13. A memory device comprising:
  a read/write circuit comprising a plurality of latches in a page buffer; and
  a control circuit suitable for controlling the read/write circuit to read the target data stored in a target page using a plurality of read voltages having different levels, respectively, and to sequentially store first and second read data, which correspond to the target data read with different-level read voltages among the plurality of read voltages, in a plurality of latches including a first latch and a second latch, respectively,
  a controller suitable for performing a first ECC decoding operation on the first read data stored in the first latch and storing third read data, which corresponds to the target data read with a different-level read voltage among the plurality of read voltages, in the first latch while the first ECC decoding operation is performed, and performing a second ECC decoding operation on the second read data stored in the second latch, when the first ECC decoding operation fails and,
  a current number of repeated ECC decoding operations including the first ECC decoding operation and the second ECC decoding operation is less than a preset ECC decoding repetition number.

14. The memory device of claim 13, wherein the control circuit controls the read/write circuit to read the target data, using the plurality of read voltages written in a read voltage table stored in the control circuit.

15. The memory device of claim 13, wherein when a discharge command for the target page is received, the control circuit controls the read/write circuit to perform a discharge operation on the target page.

16. The memory device of claim 13, wherein the control circuit controls the read/write circuit to read the target data using a preset initial read voltage, and to store initial read data corresponding to the target data in any one of the plurality of latches.

17. A memory system comprising:
  a memory device; and
  a controller,
  wherein the memory device includes:
  a memory cell array including a target region for storing target data;
  a region buffer including a plurality of latches including a first latch and a second latch; and
  a control circuit suitable for:
    sequentially reading the target data using a plurality of read voltages having different levels in response to a read command from the controller; and
    sequentially storing first and second read data, which correspond to the target data read with different-level read voltages among the plurality of read voltages, in the first and second latches,
  wherein the controller loads the first read data stored in the first latch and performs a first decoding operation on the first read data and storing third read data, which corresponds to the target data read with a different-level read voltage among the plurality of read voltages, in the first latch while the first ECC decoding operation is performed, and
  wherein the controller loads the second read data stored in the second latch and performs a second decoding operation on the second read data, when the first decoding operation fails and
  a current number of repeated ECC decoding operations including the first ECC decoding operation and the second ECC decoding operation is less than a preset ECC decoding repetition number.

18. The memory system of claim 17, wherein the target region includes a target page and the region buffer include a page buffer.

* * * * *